United States Patent [19]
Sheu et al.

[11] Patent Number: 5,998,832
[45] Date of Patent: Dec. 7, 1999

[54] METAL OXIDE SEMICONDUCTOR DEVICE FOR AN ELECTRO-STATIC DISCHARGE CIRCUIT

[75] Inventors: Shing-Ren Sheu, Tao-Yuan; Chung-Yuan Lee, Chung-Li, both of Taiwan

[73] Assignee: United Microelectronics, Corp., Taiwan

[21] Appl. No.: 08/955,872

[22] Filed: Oct. 22, 1997

Related U.S. Application Data

[60] Continuation of application No. 08/608,789, Feb. 29, 1996, abandoned, which is a division of application No. 08/280,113, Jul. 25, 1994, Pat. No. 5,571,737.

[51] Int. Cl.[6] .................................................. H01L 29/78
[52] U.S. Cl. ........................ 257/327; 257/314; 257/315; 257/336
[58] Field of Search ................................. 257/314, 315, 257/327, 336; 437/41, 46, 52, 57

[56] References Cited

U.S. PATENT DOCUMENTS

| | | |
|---|---|---|
| 3,891,468 | 6/1975 | Ito et al. . |
| 3,959,025 | 5/1976 | Polinsky . |
| 4,080,618 | 3/1978 | Tango et al. ........................... 357/23 |
| 4,734,752 | 3/1988 | Liu et al. ............................... 357/357 |
| 4,956,311 | 9/1990 | Liou et al. ............................. 437/45 |
| 5,053,848 | 10/1991 | Houston et al. ...................... 257/315 |
| 5,064,776 | 11/1991 | Roberts .................................. 437/41 |
| 5,141,891 | 8/1992 | Arima et al. . |
| 5,219,777 | 6/1993 | Kang . |
| 5,328,864 | 7/1994 | Yoshizumi et al. ................... 437/29 |
| 5,336,624 | 8/1994 | Walden . |
| 5,374,574 | 12/1994 | Kwon ..................................... 437/45 |

*Primary Examiner*—Carl W. Whitehead, Jr.
*Attorney, Agent, or Firm*—Rabin & Champagne, PC

[57] ABSTRACT

An improved metal oxide field effect transistor (MOSFET) provides an electro-static protection device with a high resistance to electro-static discharge. The electro-static discharge protection device has pre-gate heavily doped regions adjacent to the source and drain regions, where the pre-gate regions extend at least partially under the gate electrode. A single heavily doped pre-gate region may be provided for the MOSFET of the electro-static discharge protection circuit.

11 Claims, 3 Drawing Sheets

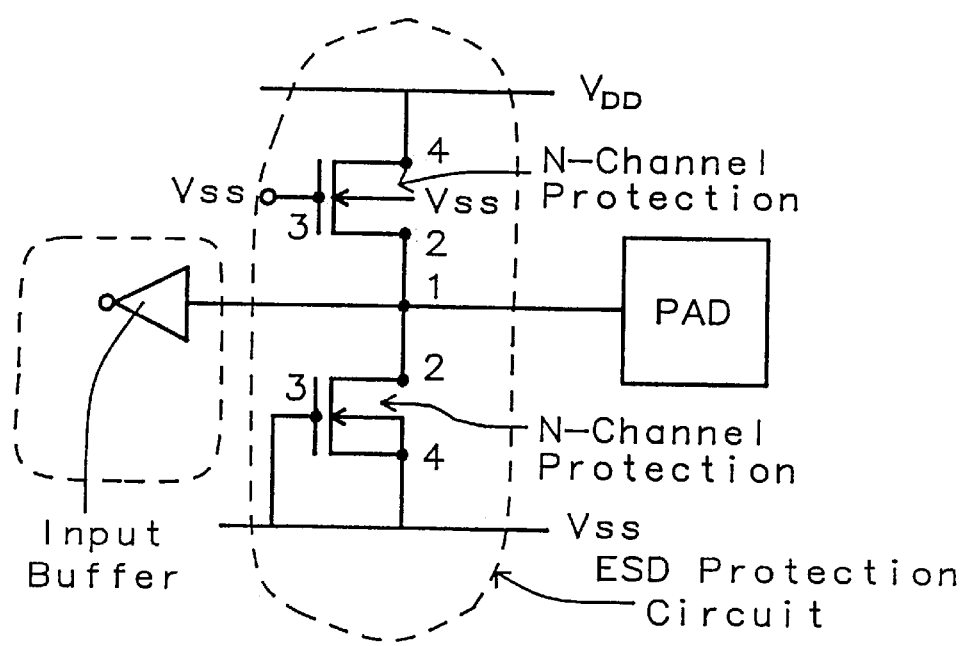
FIG. 1A - Prior Art
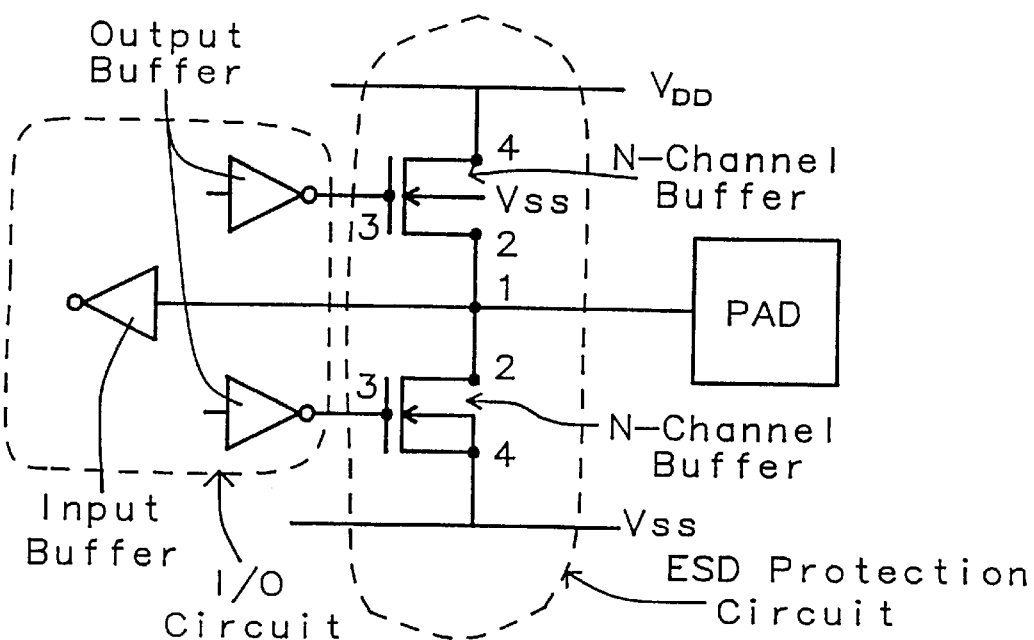
FIG. 1B - Prior Art

METAL OXIDE SEMICONDUCTOR DEVICE FOR AN ELECTRO-STATIC DISCHARGE CIRCUIT

This is a continuation of application Ser. No. 08/608,789 filed Feb. 29, 1996 and now abandoned, which was a divisional of application Ser. No. 08/280,113 filed Jul. 25, 1994 and now U.S. Pat. No. 5,571,737.

BACKGROUND OF THE INVENTION

1) Field of the Invention

This invention relates to semiconductor devices and more particularly to an improved metal oxide semiconductor field effect transistor (MOSFET) structure.

2) Description of the Prior Art

As the size of semiconductor devices decrease there have been increasing electrical device performance and manufacturing problems. In semiconductor devices, particularly metal oxide semiconductor field effect transistor (MOSFET) devices, a problem in controlling transistor characteristics develops as the feature size of these devices is reduced below one micron. To continue scaling down, new MOSFET structures have been developed to overcome problems. One such structure, the lightly doped drain (LDD) is a N-channel MOSFET structure often used to comply with hot carrier lifetime criteria for near and sub-micron MOS technology. However, low electro-static discharge (ESD) failure threshold has been reported on this lightly doped drain (LDD) structure. Moreover, present ESD protection methods focus on safeguarding the inputs against gate oxide damage. Many devices can be used as protection elements for input protection such as resistors, field transistors and bipolars. However, for the output and input/output circuits, the sensitivity to ESD stress is high when the lightly doped drain (LDD) of the MOSFET is directly tied to the output pad (see FIGS. 1A and 1B). Therefore, to reduce ESD stress, a thin gate oxide MOSFET device should be self protected if possible. Thin gate MOSFET's are often formed with lightly doped drain (LDD) structures to met hot carrier lifetime criteria, but this LDD structure has been reported susceptible to low ESD failure threshold. Therefore, there is a need for a new self protected (non-LDD) MOS device structure which is resistant to low ESD threshold failure and does not increase manufacturing costs or complexity.

SUMMARY OF INVENTION

It is an object of the invention to provide an improved structure for an MOSFET devices to improve the circuit resistance to electro-static discharge (ESD) failure.

An more specific object of the present invention is to provide an improved MOSFET structure having pre-gate heavily doped fully overlapped source/drain structures which can be connected in a electro-static discharge (ESD) protection circuit to improve ESD resistance.

A more specific object of the present invention is to provide an improved MOSFET structure having pre-gate fully heavily doped overlapped source/drain MOSFET device that provides improved electro-static discharge protection with a minimum of process steps.

Another object of the present invention is to provide a process to fabricate pre-gate fully overlapped source/drain MOSFET devices with a minimum of manufacturing steps.

In accordance with the above objects, a structure and process for an improved field effect transistor device is provided.

A semiconductor substrate with a background doping of a first conductivity type is provided. Spaced pre-gate source and drain regions of a second conductivity type are formed in the substrate. Next, a gate oxide is formed on the substrate surface. A gate is formed on the gate oxide in the regions between the pre-gate source and drain regions. The gate at least partially overhangs the pre-gate source and drain regions. Subsequently, spacers are formed on the vertical sidewalls of the gate. Source and drain regions in the substrate are formed on either side of the spacers and partially overlap the pre-gate source and drain regions. The MOSFET device of the invention comprises the pre-gate source/drain regions, the source and drain regions which overlap the pre-gate source/drain regions and the gate which at least partially overhangs the pre-gate source/drain regions. Next, using conventional processes, insulating and metal layers are added to connect the circuit elements and form a memory device. The device is connected to form the input and input/output electro-static discharge (ESD) circuits shown in FIGS. 1A and B. The combination of the device of the invention and the ESD protection circuit forms an ESD resistant circuit using a minimum number of manufacturing steps.

In a preferred embodiment of the present invention, only one pre-gate heavily doped source/drain regions may be formed, instead of two pre-gate source/drain regions. In another preferred embodiment of the invention, field oxide regions can be formed in the substrate either before or after the pre-gate source and drain regions are formed. Also, this process can be integrated with the processes to form bit lines so that the pre-gate source and drain regions can be formed with the same process steps.

BRIEF DESCRIPTION OF THE DRAWINGS

The drawings show the following:

FIGS. 1A and 1B are schematic diagrams of an Electrostatic discharge (ESD) protection circuit in accordance with the prior art.

FIG. 5 is a cross-sectional view of the device in FIG. 6 take along axis 5 of FIG. 6.

DETAILED DESCRIPTION OF THE PREFERRED EMBODIMENTS

The present inventions will be described in detail with reference to the accompanying drawings. It should be noted that the drawings are in greatly simplified form. In practice the memory device structure will be one of many supported on a common substrate connected with suitable metallurgy in various electronic circuit configurations.

Figure 2:
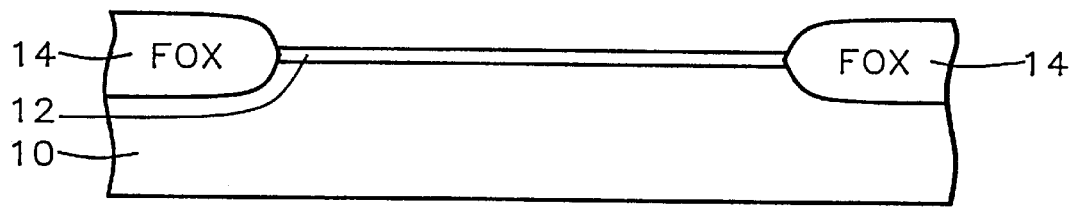
FIGS. 2 to 5 are a sequence of cross-sectional views in broken section in greatly enlarged scale that illustrate a the process of the invention at various steps of fabrication.

As shown in FIG. 2, the substrate 10 shall be a monocrystalline silicon semiconductor body with many devices fabricated therein, as is well known in the art. The substrate 10 is preferable formed of monocrystalline silicon having a surface plane with a crystalline orientation of <1 0 0>. The background substrate dopant is of a first conductivity type and preferably the first conductivity type is p-type. Also, preferably the substrate is doped with boron with a concentration in the range of 1E14 to 1E16 atoms/cm$^3$. In addition, wells of an opposite type conductivity doping may be formed in the substrate in which to produce devices of an opposite conductivity type, as well known by those skilled in the art.

Next, a thin insulating layer 12 is formed on the surface of the semiconductor substrate. The thin insulating layer 12 is preferably composed of silicon oxide with a thickness in the range of 100 to 400 angstroms and preferably a thickness of approximately 300 angstroms. Thin insulating layer 12 can be grown in a dry oxygen or steam environment at a temperature of approximately 900° C. Insulating layer 12 covers the entire surface of the substrate 10.

After the formation of the thin insulating layer 12, an oxidation resistant masking layer (not shown) is formed overlying layer 12. The oxidation resistant masking layer is preferably formed of silicon nitride with a thickness in the range of 1000 to 3000 angstroms and with a thickness more preferably of 1500 angstroms. The masking layer can be formed of silicon nitride layer by reacting silane and ammonia at atmospheric pressure at 700 to 900° C., or by reacting dichlorosilane and ammonia at reduced pressure (LPCVD) at approximately 700° C. Also, silicon nitride can be formed by plasma enhanced chemical vapor deposition (PECVD) by reacting silane with ammonia or nitrogen in a glow discharge at a temperature between 200 and 350° C.

Next, using standard photolithographic processes, openings in the oxidation resistant masking layer are formed that define the thick field oxide regions 14. Subsequently, as shown in FIG. 2, thick field oxide regions 14 are formed in the openings that define the field oxide layer. The field oxide layer 14 has a thickness in the range of 4000 to 7000 angstroms and more preferably a thickness of 5000 angstroms. Field oxide layer 14 can be formed by a conventional atmospheric thermal process where water vapor is reacted with the exposed substrate at a temperature in the range of 700 to 1200° C. In the reaction forming the oxide layer 38, a portion of the underlying silicon is consumed. Typically, for a given silicon oxide thickness, the amount of substrate consumed is approximately one half of the oxide thickness. As illustrated in FIG. 2, this consumption of the silicon substrate forms a depression in substrate surface 10 where the field oxide 14 is grown. Subsequently, the remaining portions of the masking layer are removed.

At this point an optional threshold voltage implant ($V_t$ implant) can be performed to form lightly doped $V_t$ regions (not shown in FIGS.). The lightly doped Vt regions are used to adjust the threshold voltage of the cell by changing the impurity concentration at the silicon-gate oxide interface. See Weste, Neil H. E., and Kamran Eshraghian. *PRINCIPLES of CMOS VLSI Design: a systems perspective*, Reading: Addison-Wesley P, 1993 at 48–50 (for detailed discussion of threshold voltage adjustment processes). The lightly doped $V_t$ regions are formed near the substrate surface by ion implantation of ions of a first conductivity type, preferably $BF_2$ ions, with an implant energy in the range of 40 to 80 Kev and dosage in the range of 1E12 to 1E13 atoms/cm$^2$. Lightly doped $V_t$ regions have an impurity concentration in the range of 1E16 to 5E17 atoms/cm$^3$. Lightly doped $V_t$ regions have a depth from the substrate surface in the range of 0.05 to 0.15 angstroms.

Figure 2A:
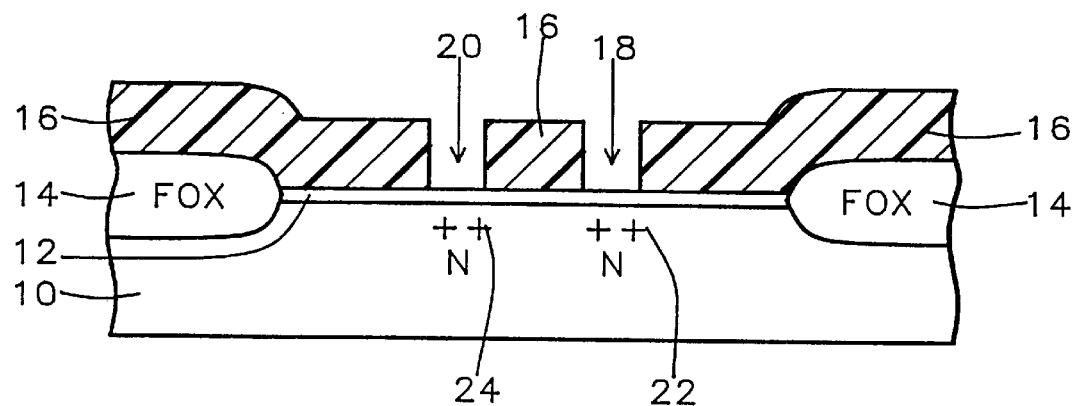

As shown on FIG. 2A, a photoresist layer 16 is formed, patterned and etched to form openings which define the pre-gate source and drain regions 22, 24 on the oxidation resistant masking layer 12 surface.

Next, impurity ions of a second conductivity type are implanted through the openings 18, 20 to form pre-gate heavily doped source and drain regions 22, 24 in substrate 10. The pre-gate source and drain regions 22, 24 are formed by ion implantation of ions of a second conductivity type, with an implant energy in the range of 60 to 120 Kev and dosage in the range of 1E14 to 1E16 atoms/cm$^2$. The ions implanted to form first doped regions 46 can be phosphorus, arsenic or any n-type ions. Pre-gate source and drain regions 22, 24 have an impurity concentration in the range of 1E18 to 1E21 atoms/cm$^3$. Pre-gate source and drain regions 22, 24 have a depth in the range of 0.2 to 0.6 microns. The substrate surface between the pre-gate source and drain 24, 22 is the channel region.

In a preferred embodiment of the present invention, only one pre-gate heavily doped source/drain region is formed. In another preferred embodiment of the invention, the field oxide regions 14 could be formed before, instead of after, the formation of the pre-gate source and drain regions.

Figure 3:
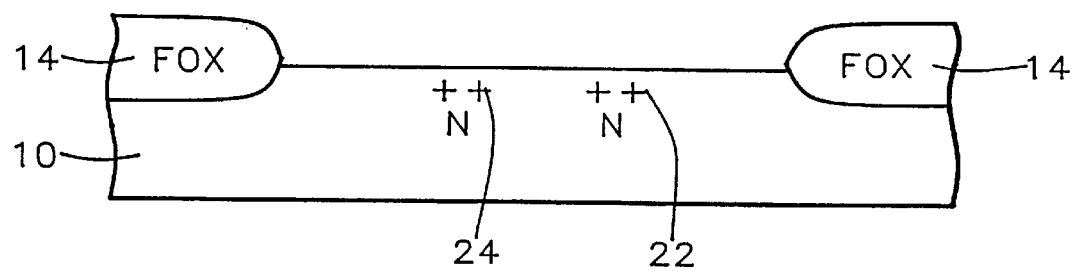
Figure 4:
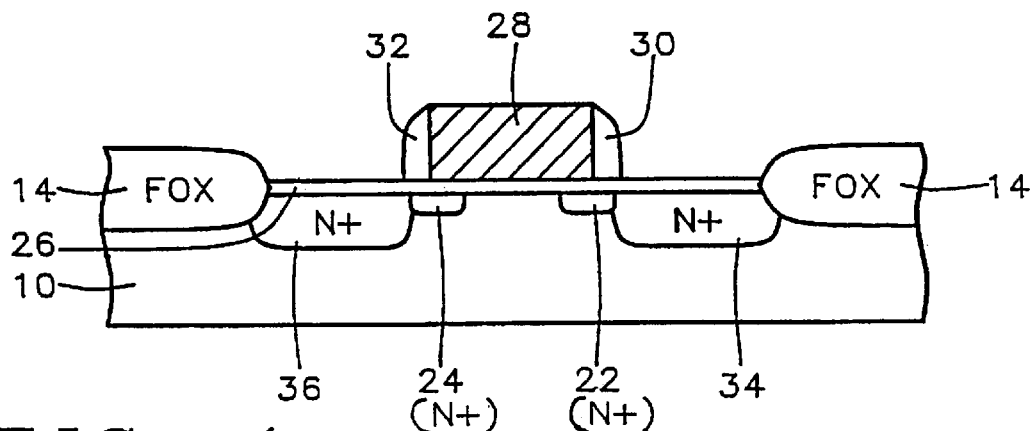

Following this, as shown in FIG. 3, the thin insulating layer 12 is etched away. Now, gate oxide layer 26 is formed on the substrate surface as shown in FIG. 4. Gate oxide layer 26 can be grown in a dry oxygen or steam environment at a temperature of approximately 900° C. Gate oxide layer 26 has a thickness in the range of 100 to 400 angstroms and more preferably a thickness of approximately 300 angstroms.

A polycrystalline silicon layer (not shown) is now formed on the substrate 10 surface which is used to form the gate electrode. In the alternative, a polycide layer or other metal layers could also be formed. The polycrystalline silicon layer has a thickness in the range of 2000 to 5000 and more preferably a thickness of approximately 3000 angstroms. The polycrystalline silicon layer can be deposited by pyrolizing silane in a low pressure chemical vapor deposition process at approximately 620° C. Using standard photolithographic processes, the polysilicon layer is anisotrophically etched to form a gate electrode 28 overlying the channel region, the gate having vertical sidewalls, and the gate at least partially overhangs the pre-gate heavily doped source/drain regions 22, 24, as shown in FIG. 4. Gate electrode 28 has a thickness in the range of 2000 to 5000 angstroms and a width in the range of 0.8 to 3.0 microns.

The gate electrode 28 can be doped using a conventional $POCl_3$ diffusion process at 835 to 935° C., as is well known by those skilled in the art. Gate electrode 28 can also be doped using a N+ implant with a dosage of 1E15 to 1E16 ions/cm$^2$ and a 40 to 80 Kev energy. Gate electrode 28 has an impurity concentration preferably of greater than 1E19 atom/cm$^3$. The gate electrode can also be formed of aluminum, tungsten, molybdenum, molybdenum disilicide ($MoSi_2$), tantalum disilicide ($TaSi_2$), tungsten disilicide ($WSi_2$), titanium disilicide ($TiSi_2$), or cobalt disilicide ($CoSi_2$) or any refractory metal.

A first insulating layer (not shown) is formed on the substrate surface. This first insulating layer can be formed of silicon oxide. The first insulating layer can be formed using a conventional chemical vapor deposition (CVD) process. The first insulating layer is anisotrophically etched to form spacers 30, 32 on the vertical sidewall of the gate as shown in FIG. 4. The spacers 30, 32 have a width in the range of 1000 to 2500 angstroms.

Next, ions of a second conductivity type are implanted into the substrate 10 using openings between the field oxide 14 and the spacers 30, 32 as a mask to form source and drain regions 34, 36. The implant can use arsenic or phosphorus ions. The source/drain implantation is performed at an energy of 60 to 100 Kev and with a dosage in the range of 1E15 to 1E16 atoms/cm$^3$. Source and drain regions 34, 36 have an impurity concentration in the range of 1E19 to 1E21 atoms/cm$^{3.}$ and more preferably a concentration of greater than 1E20 atoms/cm$^3$.

A second insulating layer is then formed on the substrate surface. The second insulation layer can be formed of several standard insulating materials including borophosphosilicate glass (BPSG), phosphosilicate glass (PSG) and silicon oxide. Standard atmospheric pressure, low pressure and plasma enhance chemical vapor deposition processes (APCVD, LPCVD, PECVD) can be used to form the second insulating layer. A second insulation layer composed of borophosphosilicate glass (BPSG) can be formed by low pressure chemical vapor deposition (LPCVD) using tetra-ethylorthosilicate (TEOS) as a reactant. Boron and phosphorus can be added to the ambient during the formation of the borophosphosilicate glass layer. The second insulation layer of BPSG is thermally treated at a temperature of 850° C. for 30 minutes to cause flow and planarization. The second insulating layer composed of BPSG has a thickness in the range of 3000 to 7000 angstroms and preferably a thickness of 4000 angstroms. As an alternative, a second insulating layer composed of silicon oxide (undoped silicate glass) can have a thickness in the range of 1000 to 2000 angstroms and preferably a thickness of 1500 angstroms.

Figure 5:
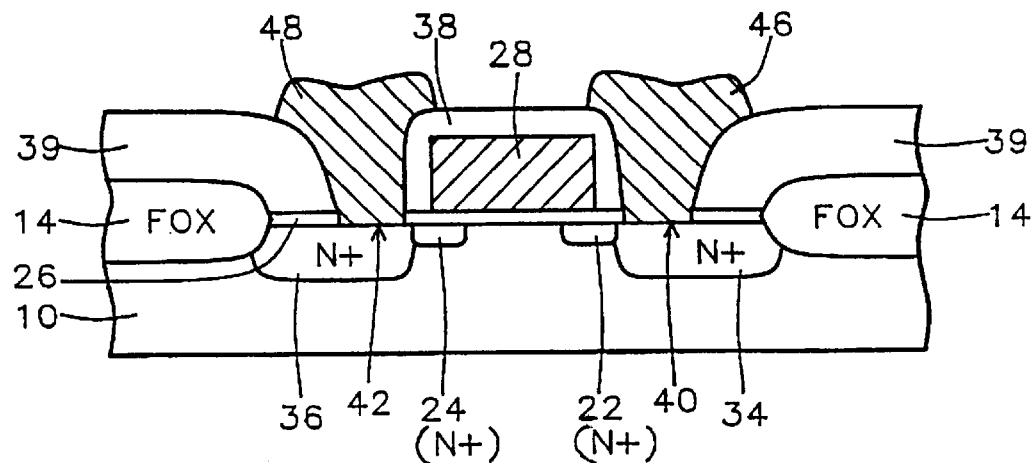
Figure 6:
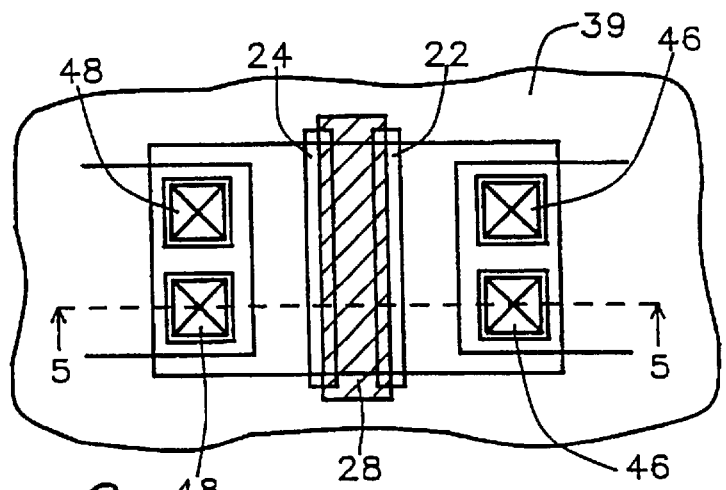
FIG. 6 is a top plan view of the invention shown in FIG. 5.

Next, as shown in FIGS. 5 and 6, the second insulation layer is anisotropically etched to form contact openings 40 and 42 on the substrate surface over the source and drain regions 34, 36. Remaining portions of the second insulating layer are layer 38 (over the gate 28) and layer 39 which overhangs the field oxide 14.

Metal contacts 46, 48 are formed over the source and drain regions 34, 36. Metal contacts 46 and 48 can be formed of aluminum, copper, or other suitable metallurgical material. Metal contacts 46 and 48 can be formed by standard photolithographic, etching and metal deposition processes.

The invention's pre-gate fully overlapping source and drain structure 22, 24, 34, 36, 28, 30, 33 can be used in many circuits including read only memories (ROM), electrically programmable read only memories (EPROM), dynamic random access memory (DRAM), static random access memory (SRAM) and other devices. With these devices, the pre-gate source and drain can be created in the same process step in the Electro-Static Discharge (ESD) input protection circuit (FIG. 1B) and in the I/O buffer (FIG. 1A). Therefore, a circuit with ESD resistance and a high saturation current and lower breakdown voltage N-channel MOSFET is produced without increasing the number of process steps. Compared with a lightly doped drain (LDD) structure, this invention's benefit is lower breakdown voltage and higher electro-static discharge (ESD) resistance. Another advantage is this new invention can coexist with a lightly doped drain (LDD) structure without increasing the number of processing steps.

While the invention has been particularly shown and described with reference to the preferred embodiments thereof, it will be understood by those skilled in the art that various changes in form and details may be made without departing from the spirit and scope of the invention.

What is claimed is:

1. A semiconductor device formed in and on a semiconductor substrate having a surface background dopant of a first conductivity type, the device comprising:

an ESD protection circuit connected to a pad, the ESD protection circuit providing ESD resistance for the device; and an input/output (I/O) buffer connected to the ESD protection circuit and to the pad, wherein the ESD protection circuit and the I/O buffer each include a MOSFET comprising:

a gate oxide layer on the substrate;

spaced source and drain regions of a second conductivity type extending into the substrate thereby defining a channel region therebetween;

a gate electrode having sidewalls formed on the gate oxide layer and extending over the channel region;

a first pre-gate region adjacent either the source region or the drain region, the first pre-gate region doped to the second conductivity type, separated from the gate electrode by the gate oxide layer and extending partially under the gate electrode; and spacers formed on the sidewalls of the gate electrode with one of the spacers overlying a part of the first pre-gate region.

2. The device of claim 1, wherein the first conductivity type is P-type and the second impurity type is N-type.

3. The device of claim 1 wherein the gate electrode is formed of polycrystalline silicon and a material selected from the group consisting of: molybdenum disilicide ($MoSi_2$), tantalum disilicide ($TaSi_2$), tungsten disilicide ($WSi_2$), titanium disilicide ($TiSi_2$), cobalt disilicide ($CoSi_2$) and refractory metals.

4. The device of claim 1 wherein the second conductivity type impurity of the first pre-gate region is selected from the group consisting of phosphorus and arsenic.

5. The semiconductor device of claim 1 wherein the first pre-gate region has an impurity concentration in the range of $1 \times 10^{18}$ to $1 \times 10^{21}$ atoms/cm$^3$.

6. The semiconductor device of claim 1 wherein the source region and the drain region each has an impurity concentration in the range of $1 \times 10^{19}$ to $1 \times 10^{21}$ atoms/cm$^3$.

7. The semiconductor device of claim 1, further comprising a second pre-gate region adjacent either the source region or the drain region so that a pre-gate region is provided adjacent each of the source and the drain regions, the second pre-gate region doped to the second conductivity type, separated from the gate electrode by the gate oxide layer and extending partially under the gate electrode.

8. The device of claim 7 wherein the first conductivity type is P-type and the second impurity type is N-type.

9. The device of claim 7 wherein the second conductivity type impurity of the first and the second pre-gate region is selected from the group consisting of phosphorus and arsenic.

10. The semiconductor device of claim 7 wherein the first and second pre-gate regions have impurity concentrations in the range of $1 \times 10^{18}$ to $1 \times 10^{21}$ atoms/cm$^3$.

11. The semiconductor device of claim 7 wherein the source region and the drain region each has an impurity concentration in the range of $1 \times 10^{19}$ to $1 \times 10^{21}$ atoms/cm$^3$.

* * * * *